(12) United States Patent  (10) Patent No.: US 7,781,270 B2
Pei  (45) Date of Patent: Aug. 24, 2010

(54) METHOD FOR FABRICATING ELECTRONIC DEVICES INTEGRATED ON A SINGLE SUBSTRATE

(75) Inventor: Zing-Way Pei, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 656 days.

(21) Appl. No.: 11/608,846

(22) Filed: Dec. 11, 2006

(65) Prior Publication Data

US 2008/0048188 A1   Feb. 28, 2008

(30) Foreign Application Priority Data

Aug. 28, 2006   (TW) ............................. 95131534 A (51) Int. Cl.
*H01L 21/00* (2006.01)
*H01L 21/84* (2006.01)
(52) U.S. Cl. ................... 438/149; 438/99; 438/151; 438/158; 438/761; 438/763; 438/780
(58) Field of Classification Search ............... 438/209, 438/149, 151, 158, 99, 761, 763, 780
See application file for complete search history.

(56) References Cited

U.S. PATENT DOCUMENTS

| 6,697,694 B2 | 2/2004 | Mogensen |
| 2003/0151118 A1* | 8/2003 | Baude et al. ................. 257/620 |
| 2007/0007342 A1* | 1/2007 | Cleeves et al. .............. 235/435 |

OTHER PUBLICATIONS

Article Titled "Printed Electronics for System Application" jointly authored by Z. Pei et al., International Symposium on VLSI Technology, Systems, and Applications(VLSI-TSA), Apr. 24-26, 2006. (pp. 74-77).

* cited by examiner

*Primary Examiner*—Ha Tran T Nguyen
*Assistant Examiner*—Aaron A Dehne
(74) *Attorney, Agent, or Firm*—Jianq Chyun IP Office

(57) ABSTRACT

Electronic devices integrated on a single substrate and a method for fabricating the same are provided. The method includes providing a substrate, and forming at least two electronic devices on the substrate, wherein the at least two electronic devices are selected from a thin film transistor, a memory, a diode, a capacitor, a resistor and an inductor. The at least two electronic devices are formed from a plurality of film layers, each film layer is formed over the substrate at the same time, and at least one layer of the film layers is formed by printing process.

10 Claims, 8 Drawing Sheets

METHOD FOR FABRICATING ELECTRONIC DEVICES INTEGRATED ON A SINGLE SUBSTRATE

CROSS-REFERENCE TO RELATED APPLICATION

This application claims the priority benefit of Taiwan application serial no. 95131534, filed Aug. 28, 2006. All disclosure of the Taiwan application is incorporated herein by reference.

BACKGROUND OF THE INVENTION

1. Field of Invention

The present invention relates to electronic devices integrated on a single substrate and a method for fabricating the same. More particularly, the present invention relates to a method of forming various types of electronic devices on a single substrate by using a printing process and the fabricated structure.

2. Description of Related Art

In the method of fabricating flexible, organic or printable electronic products, the design and the development of each electronic device in the product are respectively performed according to the product application. For example, most of the companies or enterprises fabricating the display only design the electronic devices (e.g. transistor, capacitor, etc.) of the display. The companies or enterprises fabricating the memory apparatus only design the memory devices. Usually, the advantage of the method is that the performance of a single electronic device may be quite preferred, but if it is intended to integrate different electronic devices, it is necessary to cost time and energy to research the possibility of integration, and further once the design of the product is changed, it is necessary to research the possibility of integration once again. Therefore, the conventional method has difficulty in integration, and the procedure of fabricating the product may become relatively complicated.

SUMMARY OF THE INVENTION

Accordingly, the present invention is directed to provide electronic devices integrated on a single substrate and a method for fabricating the same, so as to simplify the fabricating flow and integrate various electronic devices together.

The present invention provides a method of fabricating electronic devices integrated on a single substrate. Firstly, a substrate is provided. Then, at least two devices are formed on the substrate, wherein the at least two devices are selected from a thin film transistor, a memory, a diode, a capacitor, a resistor and an inductor. The at least two devices are formed from a plurality of film layers, each film layer is formed over the substrate at the same time, and at least one layer of the film layers is formed by a printing process.

The present invention further provides electronic devices integrated on a single substrate, which comprise a substrate and at least two devices disposed on the substrate. Particularly, the at least two devices are selected form a thin film transistor, a memory, a diode, a capacitor, a resistor and an inductor, and the at least two devices are constituted of a plurality of film layers.

In the present invention, the printing process is used to form various devices on a single substrate, and the method not only simplifies the process step, but also makes various electronic devices integrated on a single substrate successfully.

In order to the make aforementioned and other objects, features and advantages of the present invention comprehensible, a preferred embodiment accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A to 1G are schematic sectional views of the fabricating flow of the electronic devices integrated on a single substrate according to an embodiment of the present invention. Firstly, referring to FIG. 1A, a substrate 100 is provided, the substrate 100 is, for example, a flexible substrate, and the material thereof is for example the organic polymer material. Definitely, the substrate 100 may also be other materials suitable to be used as the material of the substrate of the electronic devices. In an embodiment, before each electronic device is formed on the substrate 100, a smooth layer 101 is further selectively formed on the surface of the substrate 100, so as to smooth the surface of the substrate 100. The material of the smooth layer 101 is, for example, organic polymer material, and the forming method thereof is, for example, coating process, printing process or another suitable film layer forming process. In this embodiment, the printing process is adopted preferably.

Figure 1A:
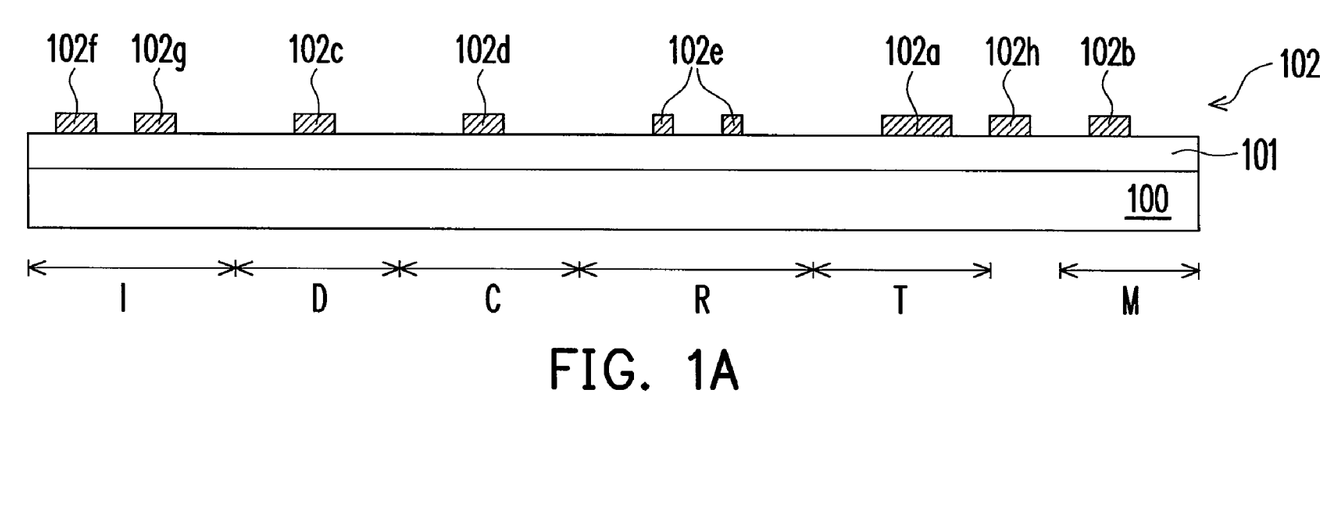
FIGS. 1A to 1G are schematic sectional views of the fabricating flow of the electronic devices integrated on a single substrate according to an embodiment of the present invention.

Then, a first patterned conductive layer 102 is formed on the smooth layer 101. In this embodiment, forming a thin film transistor, a memory, a diode, a capacitor, a resistor and an inductor on the substrate 100 is taken as an example for illustration, but the present invention is not limited to form all the electronic devices as above mentioned on the substrate 100. In this embodiment, the thin film transistor, the memory, the diode, the capacitor, the resistor and the inductor are formed on the substrate 100, so the substrate 100 includes a thin film transistor region T, a memory region M, a diode region D, a capacitor region C, a resistor region R and an inductor region I. Therefore, the first patterned conductive layer 102 formed on the smooth layer 101 includes a gate 102a formed in the thin film transistor region T, a first electrode 102b formed in the memory region M, a Schottky electrode 102c formed in the diode region D, a lower electrode 102d formed in the capacitor region C, a contact end 102e formed in the resistor region R and two electrodes 102f and 102g formed in the inductor region I. In an embodiment, a contact structure 102h is further formed on the smooth layer 101. Here, preferably, the method of forming the first patterned conductive layer 102 is the printing process. The material of the first patterned conductive layer 102 is, for example, organic conductive material.

Figure 1B:
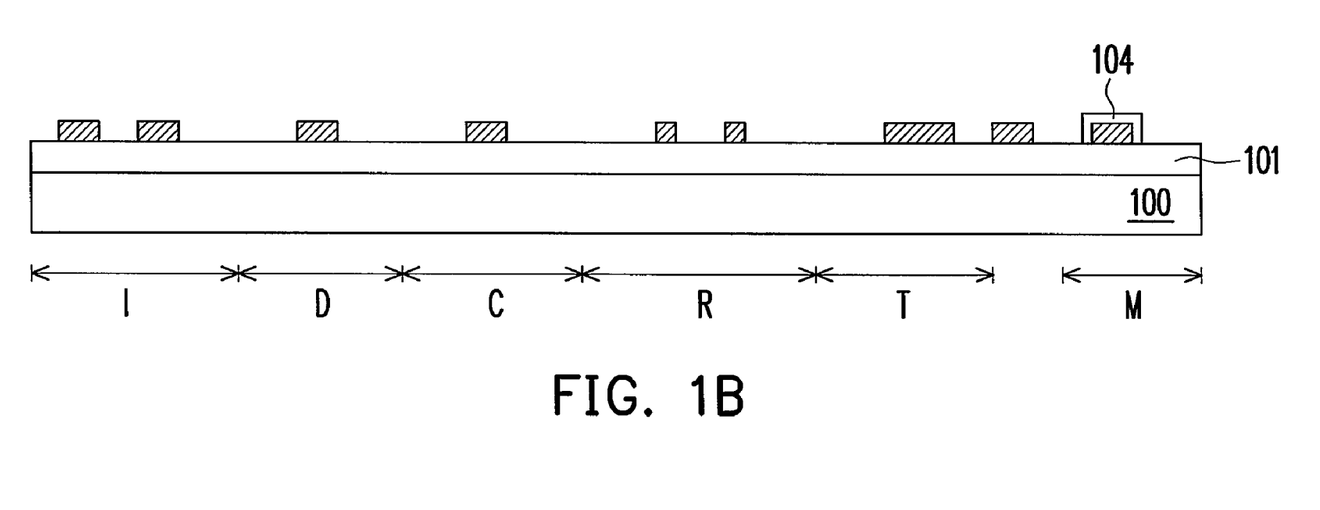

Next, referring to FIG. 1B, an active layer 104 is formed on the first electrode 102b in the memory region M. The material of the active layer 104 is, for example, polystyrene, or other materials suitable to be used as the material of the active layer of the memory device. Here, preferably, the method of forming the active layer 104 is the printing process.

Figure 1C:
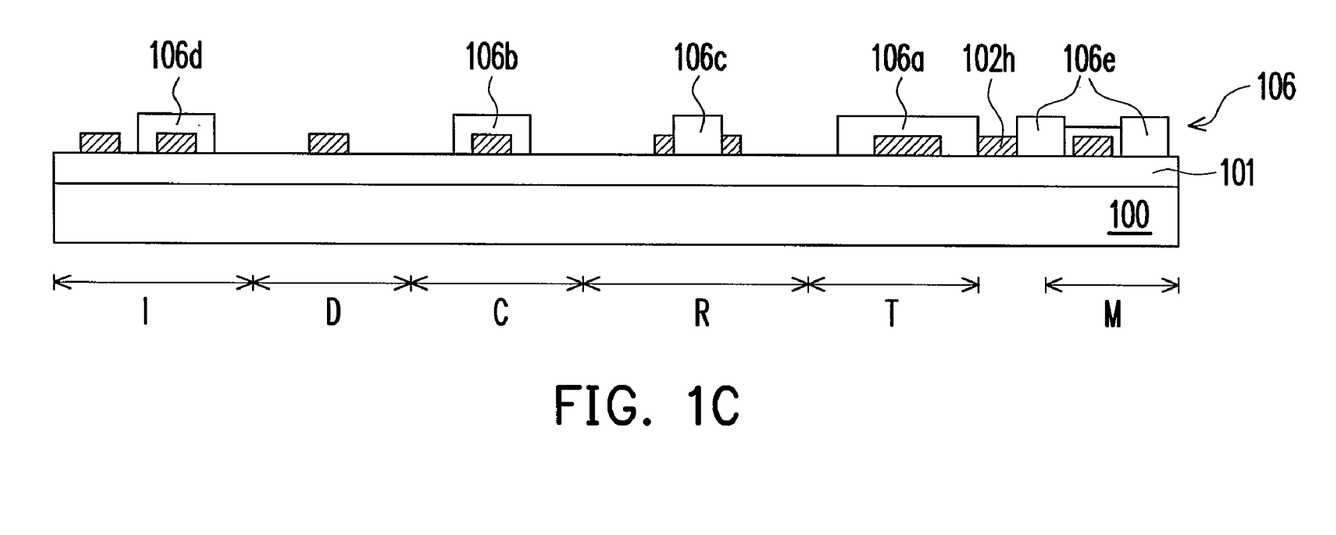

Then, referring to FIG. 1C, a patterned insulation layer 106 is formed over the substrate 100, and the patterned insulation layer 106 includes a gate insulation layer 106a formed in the thin film transistor region T, a capacitance dielectric layer 106b formed in the capacitor region C and an insulation layer 106c formed in the resistor region R. In an embodiment, the patterned insulation layer 106 further includes an insulation pattern 106e, for separating the contact structure 102h and the components in the memory region M. Here, preferably, the method of forming the patterned insulation layer 106 is the printing process. The material of the patterned insulation layer 106 is, for example, organic insulation material.

Figure 1D:
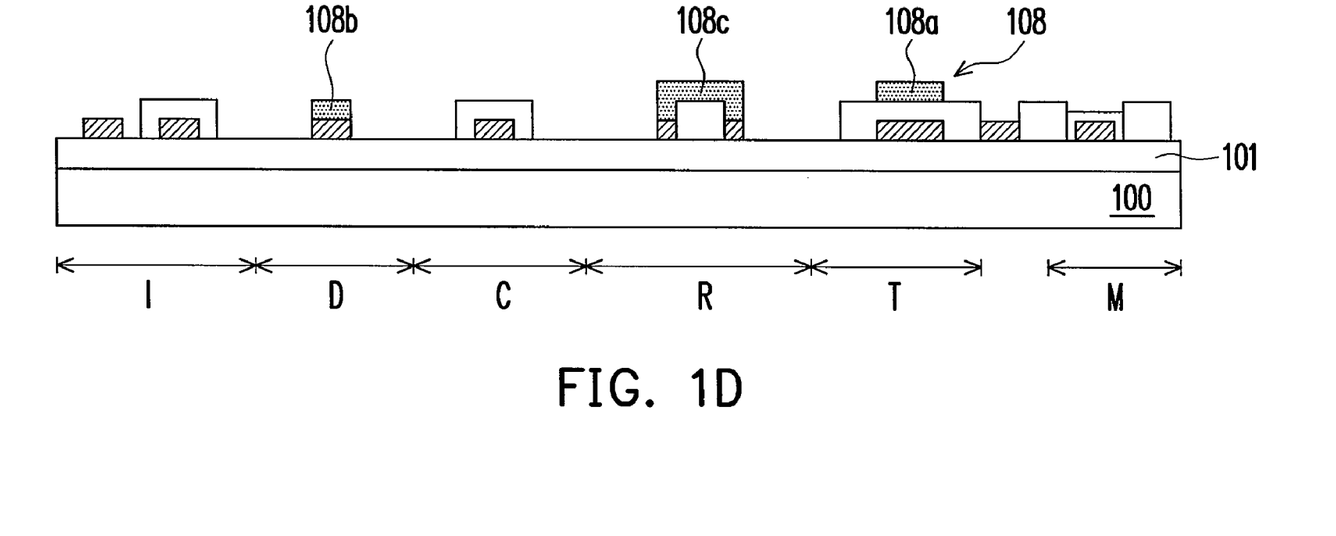

Referring to FIG. 1D, a patterned semiconductor layer 108 is formed on the patterned insulation layer 106, the patterned semiconductor layer 108 includes a channel layer 108a formed in the thin film transistor region T, an active layer 108b formed in the diode region D and a first resistance layer 108c formed in the resistor region R. Here, preferably, the method of forming the patterned semiconductor layer 108 is the printing process. The material of the patterned semiconductor layer 108 is, for example, the organic semiconductor material.

Figure 1E:
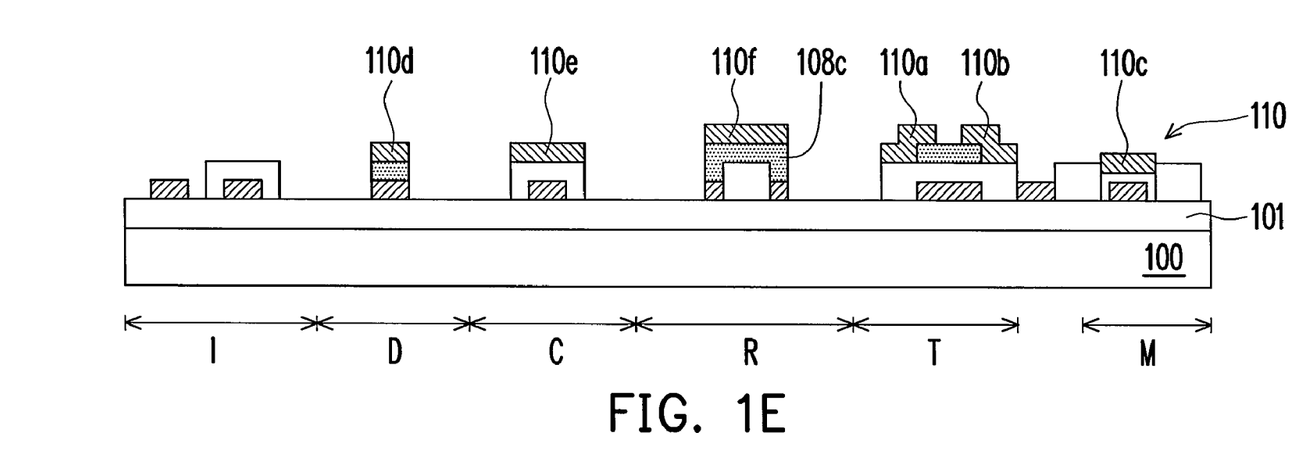

Referring to FIG. 1E, a second patterned conductive layer 110 is formed on the patterned semiconductor layer 108, the second patterned conductive layer 110 includes a source 110a and a drain 110b formed in the thin film transistor T, a second electrode 110c formed in the memory region M, an ohmic contact layer 110d formed in the diode region D, an upper electrode 110e formed in the capacitor region C and a second resistance layer 110f formed in the resistor region R. It should be noted that in the resistor region R, only the first resistance layer 108c or the second resistance layer 110f can be formed, that is, one or two resistance layers may be formed as desired. Here, preferably, the method of forming the second patterned conductive layer 110 is the printing process. The material of the second patterned conductive layer 110 is, for example, organic conductive material. After the step of FIG. 1E, the fabricating of the thin film transistor, the memory, the diode, the capacitor, the resistor and the inductor on the substrate 100 is finished.

Figure 1F:
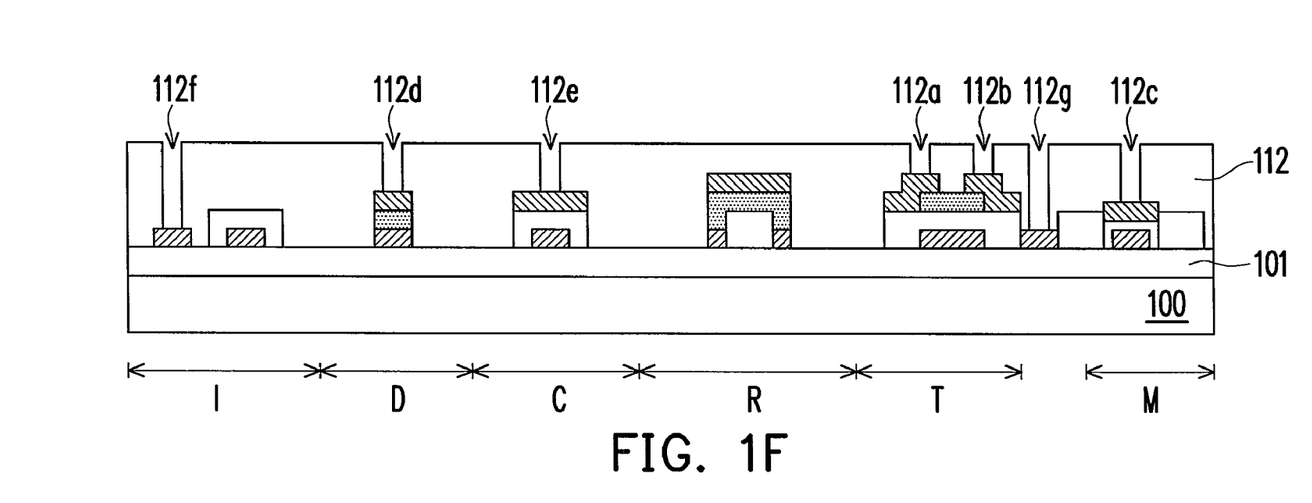
Figure 1G:
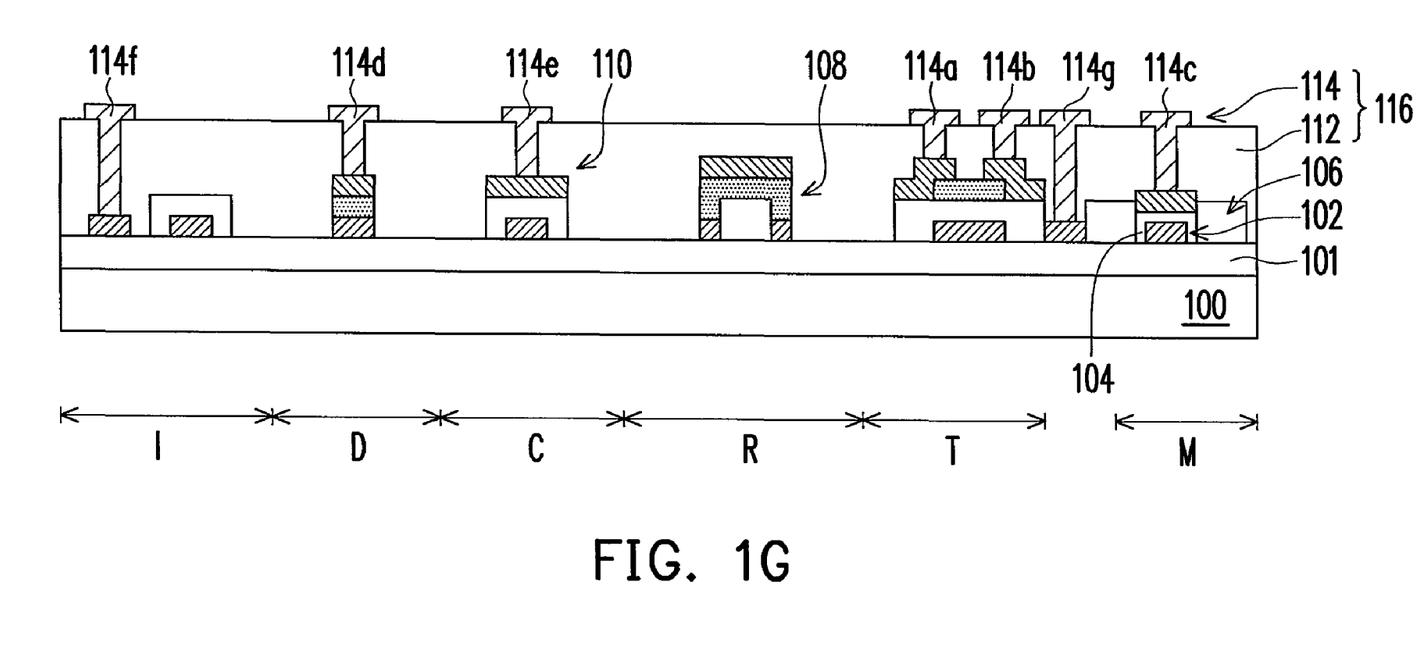

Next, an interconnect structure may be formed on the formed structure, such that the formed electronic devices may be electrically connected to other devices or external circuits. Referring to FIGS. 1F and 1G, the method of forming the interconnect structure 116 includes the following steps. A dielectric layer 112, e.g. an organic dielectric layer, is formed over the substrate 100, wherein the dielectric layer 112 has contact window openings 112a, 112b, 112c, 112d, 112e, 112f and 112g, respectively exposing a part of the devices in the thin film transistor region T, the memory region M, the diode region D, the capacitor region C and the resistor region R. Next, a conductive material 114 is filled in the contact window openings 112a, 112b, 112c, 112d, 112e, 112f and 112g, and the material thereof is, for example, organic conductive material, so as to form the contact windows 114a, 114b, 114c, 114d, 114e, 114f and 114g, and to define the conducting wire structure (not shown) electrically connected to the contact windows 114a, 114b, 114c, 114d, 114e, 114f and 114g at the same time. Here, the interconnect structure of this embodiment only shows a dielectric layer and a conductive layer as an example for illustration. Practically, the interconnect structure of this embodiment may be formed by a multi-layer structure, that is, formed by a plurality of dielectric layers and a plurality of conductive layers. Particularly, the interconnect structure 116 of this embodiment is formed by the printing process preferably.

The structure formed by the foregoing process is as shown in FIG. 1G, it includes a substrate 100, a thin film transistor T, a memory M, a diode D, a capacitor C, a resistor R and an inductor I located on the substrate 100, and the film layers forming the devices include: a first patterned conductive layer 102, which is located on the substrate 100 and includes the gate 102a of the thin film transistor, the first electrode 102b of the memory, the Schottky electrode 102c of the diode, the lower electrode 102d of the capacitor, the contact end 102e of the resistor and two electrode patterns 102f, 102g of the inductor (as shown in FIG. 1A); an active layer 104, which is located on the electrode 102b of the memory; a patterned insulation layer 106, which is located over the substrate 100 and includes the gate insulation layer 106a of the thin film transistor, the capacitance dielectric layer 106b of the capacitor and the insulation layer 106c of the resistor (as shown in FIG. 1C); a patterned semiconductor layer 108, which is located on the patterned insulation layer 106 and includes the channel layer 108a of the thin film transistor, the active layer 108b of the diode, and the first resistance layer 108c of the resistor (as shown in FIG. 1D); and a second patterned conductive layer 110, which is located on the patterned semiconductor layer 108 and includes the source 110a and the drain 110b of the thin film transistor, the second electrode 110c of the memory, the ohmic contact layer 110d of the diode, the upper electrode 110e of the capacitor and the second resistance layer 110f of the resistor. In an embodiment, the method further includes disposing an interconnect structure 116 over the devices. In another embodiment, the method further includes forming a smooth layer 101 between the substrate 100 and the devices.

In the foregoing embodiment, forming the patterned insulation layer 106 and then forming the patterned semiconductor layer 108 is taken as an example for illustration, and the formed thin film transistor is a bottom gate thin film transistor. In another embodiment of the present invention, the patterned semiconductor layer is formed first, and then the patterned insulation layer is formed, and the formed thin film transistor is a top gate thin film transistor. The detailed description is given as follows.

FIGS. 2A to 2G are schematic sectional views of the fabricating flow of the electronic devices integrated on a single substrate according to another embodiment of the present invention. Firstly, referring to FIG. 2A, a substrate 100 is provided. Before forming each electronic device on the substrate 100, a smooth layer 101 is selectively formed on the surface of the substrate 100. The relative illustration of the material of the substrate 100 and the smooth layer 101 is similar to that of the prior embodiment, so it is not described here.

Figure 2A:
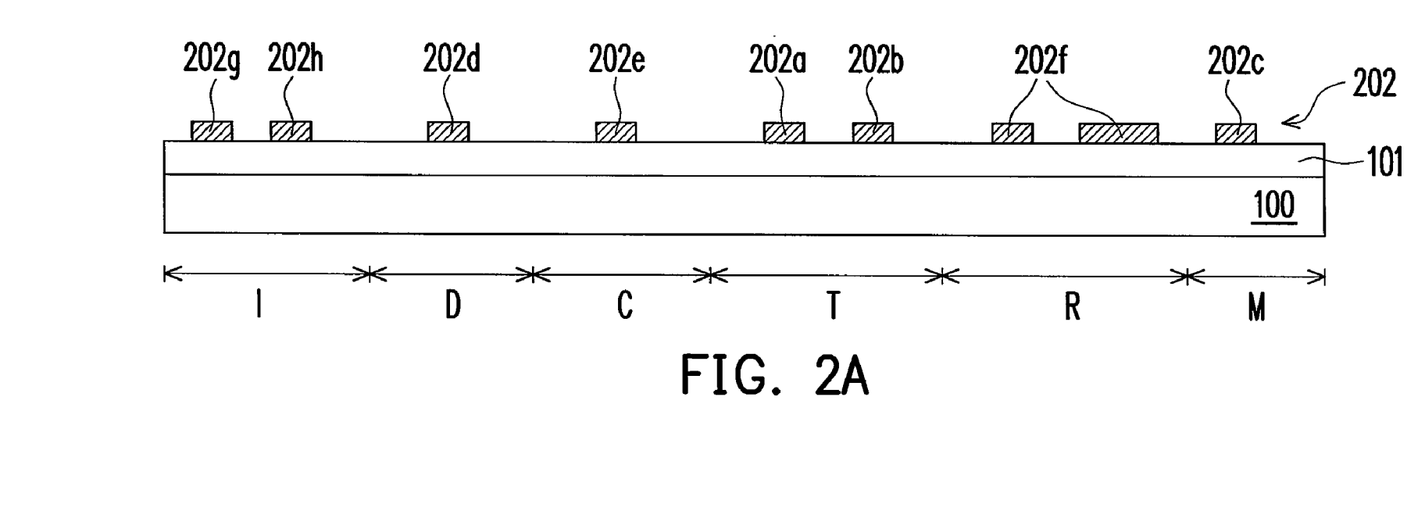
FIGS. 2A to 2G are schematic sectional views of the fabricating flow of the electronic devices integrated on a single substrate according to another embodiment of the present invention.

Then, a first patterned conductive layer 202 is formed on the smooth layer 101. In this embodiment, forming the thin film transistor, the memory, the diode, the capacitor, the resistor and the inductor on the substrate 100 is taken as an example for illustration, so the substrate 100 includes a thin film transistor region T, a memory region M, a diode region D, a capacitor region C, a resistor region R and an inductor region I. The first patterned conductive layer 202 formed on the smooth layer 101 includes a source 202a and a drain 202b formed in the thin film transistor region T, a first electrode 202c formed in the memory region M, a Schottky electrode 202d formed in the diode region D, a lower electrode 202e formed in the capacitor region C, a contact end 202f formed in the resistor region R and two electrodes 202g and 202h formed in the inductor region I. Here, preferably, the method of forming the first patterned conductive layer 202 is the printing process. The material of the first patterned conductive layer 202 is, for example, organic conductive material.

Figure 2B:
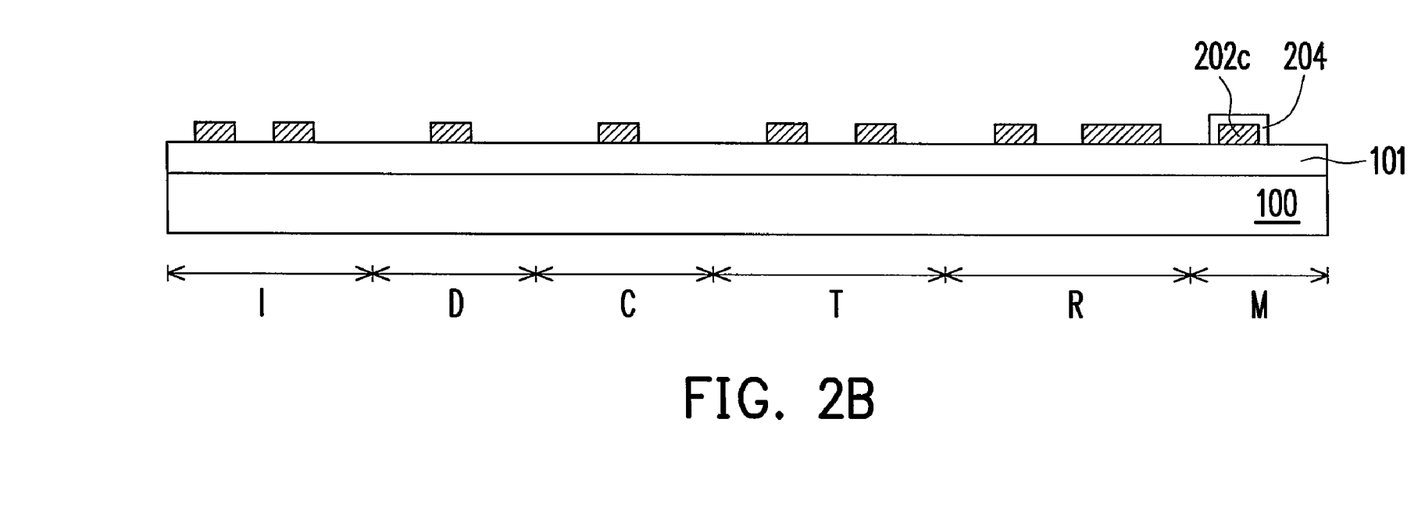

Next, referring to FIG. 2B, an active layer 204 is formed on the first electrode 202c in the memory region M. Similarly, the material of the active layer 204 is, for example, polystyrene, or other materials suitable to be used as the material of the active layer of the memory device. Here, preferably, the method of forming the active layer 204 is the printing process.

Figure 2C:
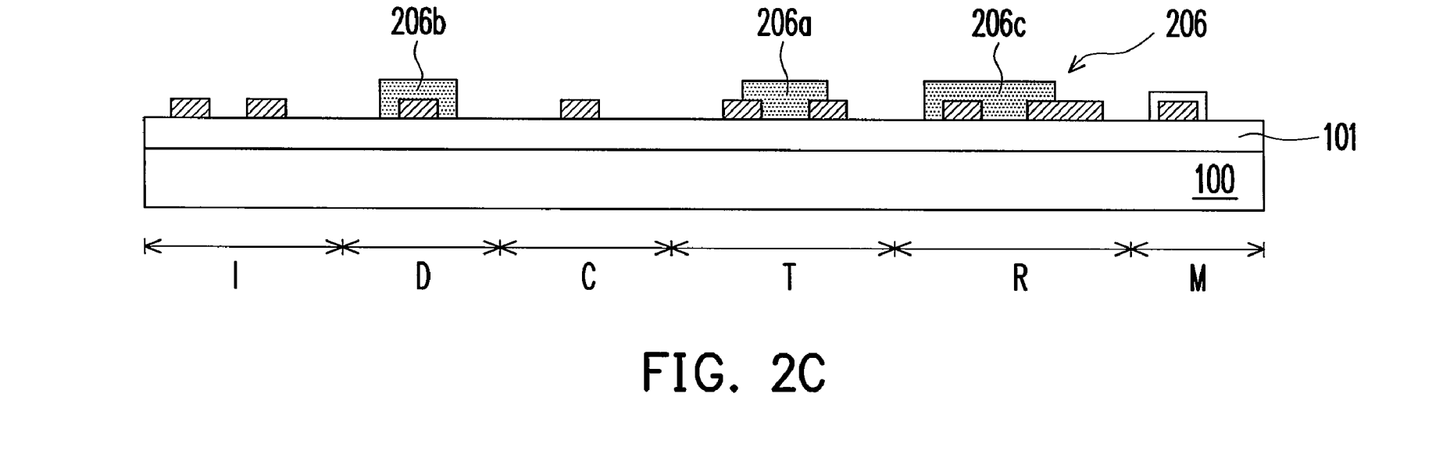

Referring to FIG. 2C, a patterned semiconductor layer 206 is formed over the substrate 100, and the patterned semiconductor layer 206 includes a channel layer 206a formed in the thin film transistor region T, an active layer 206b formed in the diode region D and a first resistance layer 206c formed in the resistor region R. Here, preferably, the method of forming the patterned semiconductor layer 108 is printing process. The material of the patterned semiconductor layer 108 is, for example, organic semiconductor material.

Figure 2D:
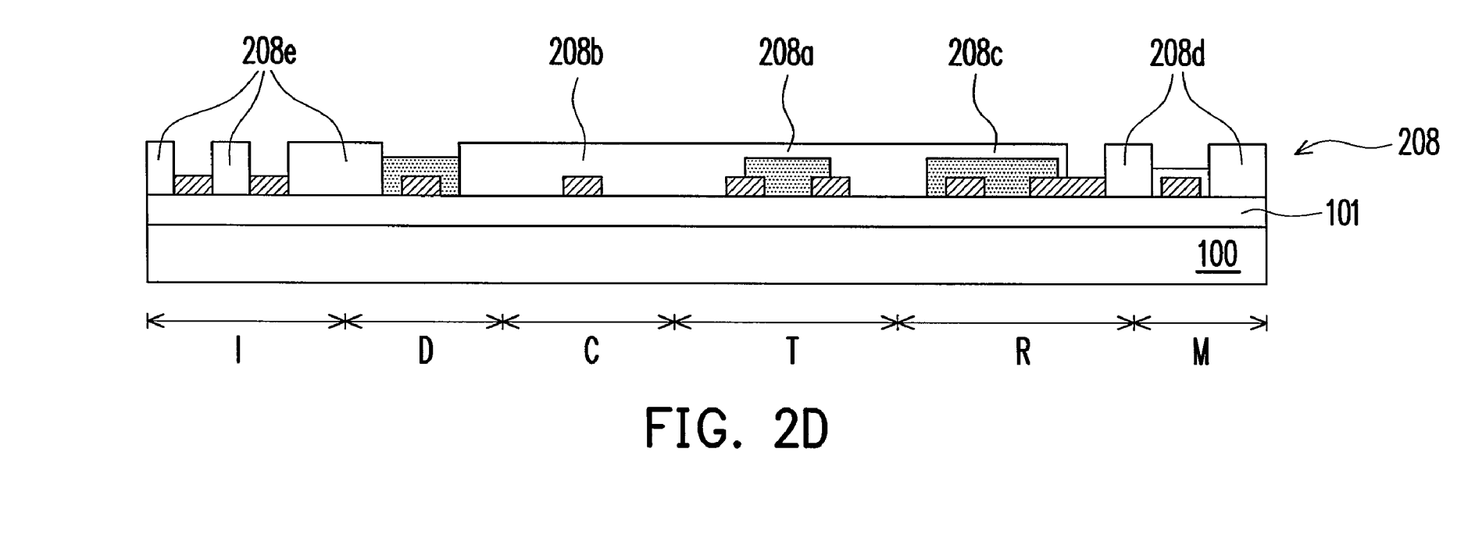

Then, referring to FIG. 2D, a patterned insulation layer 208 is formed over the patterned semiconductor layer 206, and the patterned insulation layer 208 includes a gate insulation layer 208a formed in the thin film transistor region T, a capacitance dielectric layer 208b formed in the capacitor region C and an insulation layer 208c formed in the resistor region R. In an embodiment, the patterned insulation layer 208 further includes insulation patterns 208d, 208e, for separating the devices in each region. Here, preferably, the method of forming the patterned insulation layer 208 is printing process. The material of the patterned insulation layer 208 is, for example, organic material.

Figure 2E:
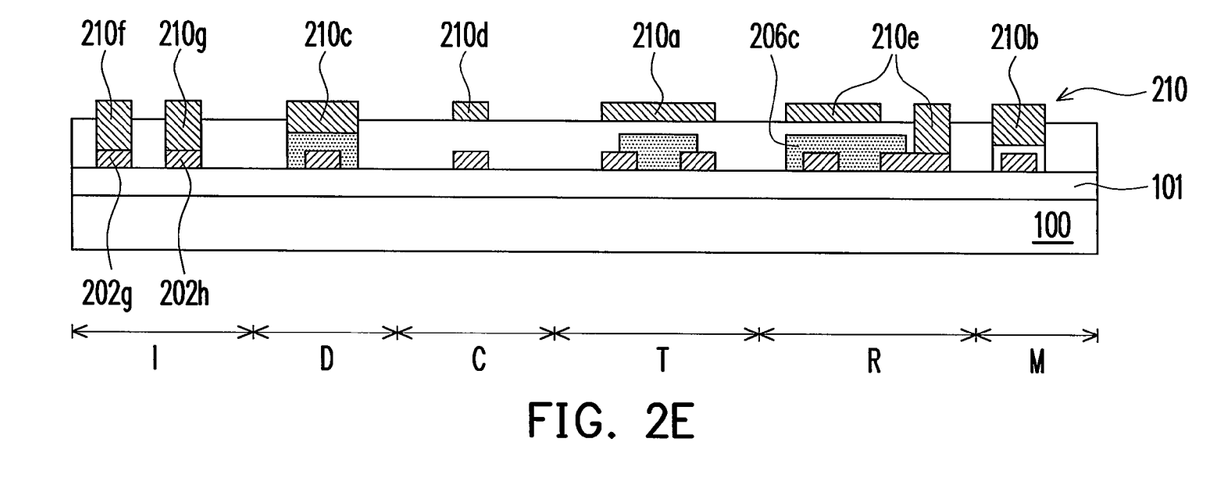

Referring to FIG. 2E, a second patterned conductive layer 210 is formed on the patterned semiconductor layer 108, the second patterned conductive layer 210 includes a gate 210a formed in the thin film transistor T, a second electrode 210b formed in the memory region M, an ohmic contact layer 210c formed in the diode region D, an upper electrode 210d formed in the capacitor region C and a second resistance layer 210e formed in the resistor region R. It should be noted that in the resistor region R, only the first resistance layer 206c or the second resistance layer 210e is formed, that is, one or two resistance layers may be formed as desired. Moreover, conductive patterns 210f and 210g electrically connected to the two electrodes 202g and 202h are selectively formed in the inductor region I. Here, preferably, the method of forming the second patterned conductive layer 210 is the printing process. The material of the second patterned conductive layer 210 is, for example, organic conductive material. After the step of FIG. 2E, the fabricating of the thin film transistor, the memory, the diode, the capacitor, the resistor and the inductor on the substrate 100 is finished.

Figure 2F:
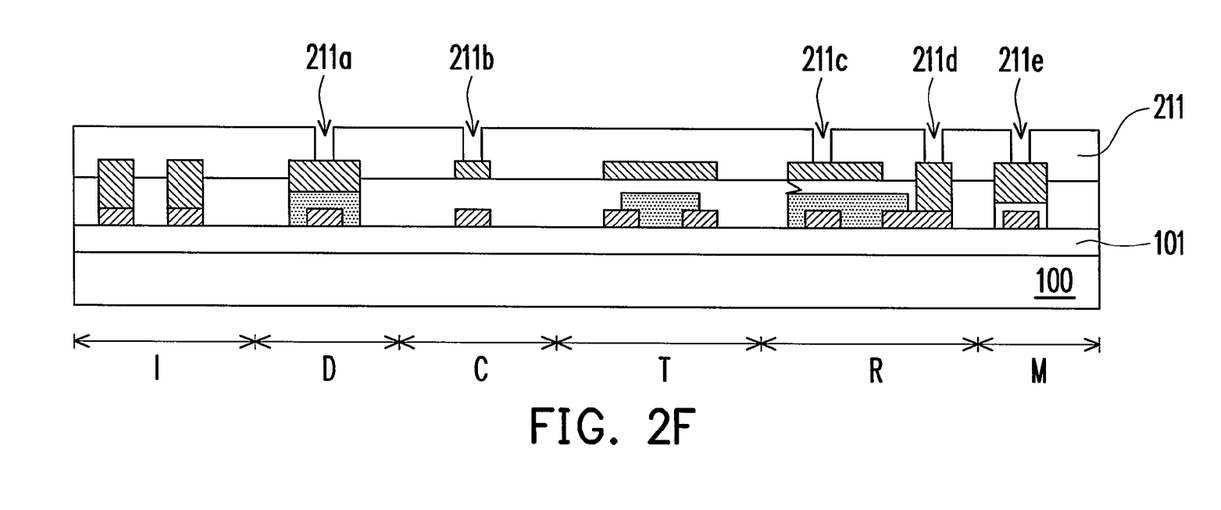
Figure 2G:
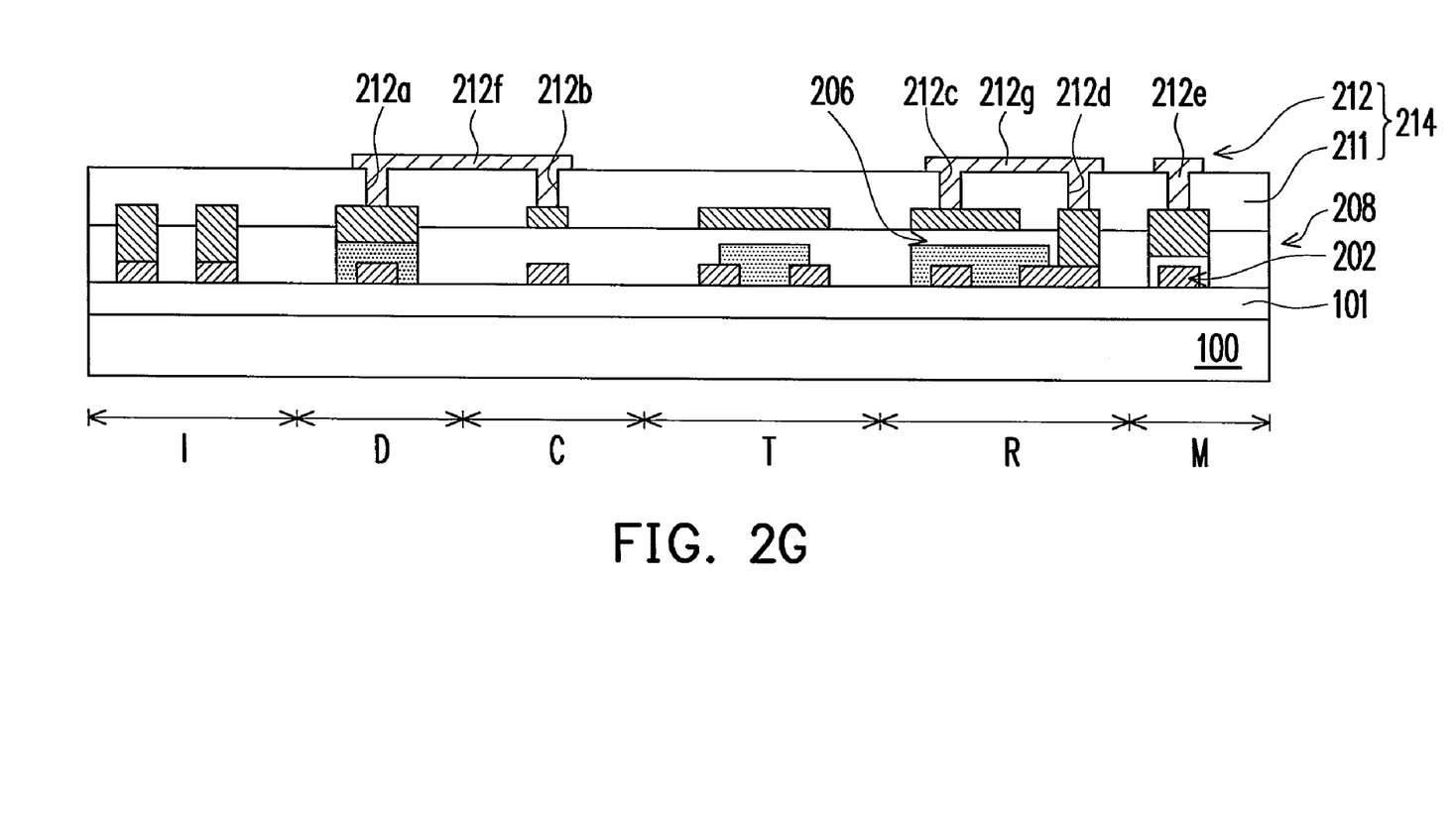

Next, an interconnect structure may be formed on the formed structure, such that the formed electronic devices may be electrically connected to other devices or external circuits. Referring to FIGS. 2F and 2G, the method of forming the interconnect structure 214 includes the following steps. A dielectric layer 211, e.g. an organic dielectric layer, is formed over the substrate 100, wherein the dielectric layer 211 has contact window openings 211a, 211b, 211c, 211d and 211e, respectively exposing apart of the devices in the memory region M, the diode region D, the capacitor region C and the resistor region R. Next, a conductive material is filled in the contact window openings 211a, 211b, 211c, 211d and 211e, and the material is, for example, organic conductive material, so as to form contact windows 212a, 212b, 212c, 212d and 212e, and to define conducting wire structures 212f and 212g at the same time. Here, the interconnect structure of this embodiment only shows a dielectric layer and a conductive layer as an example for illustration. Practically, the interconnect structure of this embodiment may be formed by a multi-layer structure, that is, formed by a plurality of dielectric layers and a plurality of conductive layers. Moreover, the design of the interconnect structure shown in the drawing is only an embodiment, and it is not used to limit the present invention. Particularly, the interconnect structure 214 of this embodiment is formed by the printing process preferably.

The structure formed by the foregoing process is as shown in FIG. 2G, it includes a substrate 100, a thin film transistor T, a memory M, a diode D, a capacitor C, a resistor R and an inductor I located on the substrate 100, and the film layers forming the devices include a first patterned conductive layer 202, which is located on the substrate 100 and includes the source 202a and a drain 202b of the thin film transistor, the first electrode 202c of the memory, the Schottky electrode 202d of the diode, the lower electrode 202e of the capacitor, the contact end 202f of the resistor and two electrode patterns 202g, 202h of the inductor (as shown in FIG. 2A); an active layer 204, which is located on the electrode 202c of the memory; a patterned semiconductor layer 206, which is located over the substrate 100 and includes the channel layer 206a of the thin film transistor, the active layer 206b of the diode, the first resistance layer 206c of the resistor (as shown in FIG. 2C); a patterned insulation layer 208, which is located over the patterned semiconductor layer 206 and includes the gate insulation layer 208a of the thin film transistor, the capacitance dielectric layer 208b of the capacitor and the insulation layer 208c of the resistor (as shown in FIG. 2D); and a second patterned conductive layer 210, which is located on the patterned insulation layer 208 and includes the gate 210a of the thin film transistor, the second electrode 210b of the memory, the ohmic contact layer 210c of the diode, the upper electrode 210d of the capacitor and the second resistance layer 210e of the resistor (as shown in FIG. 2E). In an embodiment, the method further includes disposing an interconnect structure 214 over the devices. In another embodiment, the method further includes forming a smooth layer 101 between the substrate 100 and the devices.

In the foregoing two embodiments, forming six electronic devices, i.e., the thin film transistor, the memory, the diode, the capacitor, the resistor and the inductor, on the substrate is taken as an example for illustration, but the present invention is not limited here. In the present invention, more than six or less than six electronic devices may also be formed on the substrate, the type and the number of the electronic devices integrated on a single substrate may be selected according to the requirement of the practical application product.

In an embodiment, five electronic devices, i.e., a thin film transistor, a diode, a capacitor, a resistor and an inductor, are formed on the substrate 100, as compared with the prior embodiment, the fabricating of the memory device is omitted. Therefore, in the fabricating method in FIGS. 1A to 1G or FIGS. 2A to 2F, the fabricating of the memory region M and the fabricating of each device in the memory region M are omitted, and the remaining fabricating of each film layer of the thin film transistor, the diode, the capacitor, the resistor and the inductor is the same as or similar to that of the prior embodiment.

In another embodiment, two devices, i.e., the memory and the diode, are formed on the substrate 100. That is, in FIGS. 1A to 1G and FIGS. 2A to 2F, the substrate 100 only includes a memory region M and a diode region D, and the fabricating of the thin film transistor, the capacitor, the resistor and the inductor is omitted. Similarly, the fabricating of each film layer forming the memory and the diode in the memory region M and the diode region D of the substrate 100 is the same as or similar to that of the prior embodiment.

In another embodiment, two devices, i.e., the memory and the capacitor, are formed on the substrate 100. That is, in FIGS. 1A to 1G and FIGS. 2A to 2F, the substrate 100 only includes a memory region M and a capacitor region C, and the fabricating of the thin film transistor, the diode, the resistor and the inductor is omitted. Similarly, the fabricating of each film layer forming the memory and the capacitor in the memory region M and the capacitor region C of the substrate 100 is the same as or similar to that of the prior embodiment.

In each embodiment of the present invention, at least two types of electronic devices are integrated on a single substrate, and at least one of the film layers forming each electronic device is formed by printing process, preferably, more layers of the film layers forming each electronic device are formed by printing process. Most preferably, all film layers forming each electronic device are formed by printing process. Because when the printing process is used to form each film layer forming the electronic device, only a single step is required to form the film layer having the specific pattern, as compared with the method of forming the film layer having the specific pattern with the deposition process, the lithography process and the etching process, many process time is reduced.

Moreover, in the present invention, all the required electronic devices are directly formed on a single substrate, and the interconnect structure is used to electrically connect each electronic device, so in the present invention, many types of electronic devices are integrated on a single substrate, for solving the problem of the conventional method that it is difficult to integrate each electronic device after the each electronic device is respectively fabricated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating electronic devices integrated on a single substrate, comprising:
   providing a substrate; and
   forming at least two devices on the substrate, wherein the at least two devices comprises a thin film transistor, a memory, a diode, a capacitor, a resistor and an inductor, the at least two devices are formed from a plurality of film layers, each film layer is formed over the substrate, and at least one layer of the film layers is formed by a printing process, a method for forming the at least two devices comprises:
   forming a first patterned conductive layer on the substrate, the first patterned conductive layer comprising a gate of the thin film transistor, a first electrode of the memory, a Schottky electrode of the diode, a lower electrode of the capacitor, a contact end of the resistor and two electrode patterns of the inductor;
   forming an active layer on the first electrode of the memory;
   forming a patterned insulation layer over the substrate, the patterned insulation layer comprising a gate insulation layer of the thin film transistor, a capacitance dielectric layer of the capacitor and an insulation layer of the resistor;
   forming a patterned semiconductor layer on the patterned insulation layer, the patterned semiconductor layer comprising a channel layer of the thin film transistor, an active layer of the diode and a first resistance layer of the resistor;
   forming a second patterned conductive layer on the patterned semiconductor layer, the second patterned conductive layer comprising a source and a drain of the thin film transistor, a second electrode of the memory, an ohmic contact layer of the diode, an upper electrode of the capacitor and a second resistance layer of the resistor.

2. The method of fabricating electronic devices integrated on a single substrate as claimed in claim 1, wherein the substrate is a flexible substrate.

3. The method of fabricating electronic devices integrated on a single substrate as claimed in claim 1, wherein the material of the substrate comprises organic material.

4. The method of fabricating electronic devices integrated on a single substrate as claimed in claim 1, wherein the material of at least one layer of the film layers comprises organic material.

5. The method of fabricating electronic devices integrated on a single substrate as claimed in claim 1, wherein before forming the film layers, the method further comprises forming a smooth layer on the surface of the substrate.

6. The method of fabricating electronic devices integrated on a single substrate as claimed in claim 5, wherein the smooth layer is formed by the printing process.

7. The method of fabricating electronic devices integrated on a single substrate as claimed in claim 1, wherein after forming the at least two devices, the method further comprises forming an interconnect structure over the at least two devices.

8. The method of fabricating electronic devices integrated on a single substrate as claimed in claim 7, wherein the interconnect structure is formed by the printing process.

9. A method of fabricating electronic devices integrated on a single substrate, comprising:
   providing a substrate; and
   forming at least two devices on the substrate, wherein the at least two devices comprises a thin film transistor, a memory, a diode, a capacitor, a resistor and an inductor, the at least two devices are formed from a plurality of film layers, each film layer is formed over the substrate, and at least one layer of the film layers is formed by a printing process, a method for forming the at least two devices comprises:
   forming a first patterned conductive layer on the substrate, the first patterned conductive layer comprising a source and a drain of the thin film transistor, a first electrode of the memory, a Schottky electrode of the diode, a lower electrode of the capacitor, a contact end of the resistor and two electrode patterns of the inductor;
   forming an active layer on the first electrode of the memory;
   forming a patterned semiconductor layer over the substrate, the patterned semiconductor layer comprising a channel layer of the thin film transistor, an active layer of the diode, and a first resistance layer of the resistor;
   forming a patterned insulation layer on the patterned semiconductor layer, the patterned insulation layer comprising a gate insulation layer of the thin film transistor, a capacitance dielectric layer of the capacitor and an insulation layer of the resistor; and
   forming a second patterned conductive layer on the patterned insulation layer, the second patterned conductive layer comprising a gate of the thin film transistor, a second electrode of the memory, an ohmic contact layer of the diode, an upper electrode of the capacitor and a second resistance layer of the resistor.

10. A method of fabricating electronic devices integrated on a single substrate, comprising:

providing a substrate; and forming at least two devices on the substrate, wherein the at least two devices comprises a thin film transistor, a diode, a capacitor, a resistor and an inductor, the at least two devices are formed from a plurality of film layers, each film layer is formed over the substrate, and at least one layer of the film layers is formed by a printing process, a method for forming the at least two devices comprises:

forming a first patterned conductive layer on the substrate, the first patterned conductive layer comprising a gate of the thin film transistor, a Schottky electrode of the diode, a lower electrode of the capacitor, a contact end of the resistor and two electrode patterns of the inductor;

forming a patterned insulation layer over the substrate, the patterned insulation layer comprising a gate insulation layer of the thin film transistor, a capacitance dielectric layer of the capacitor and an insulation layer of the resistor;

forming a patterned semiconductor layer on the patterned insulation layer, the patterned semiconductor layer comprising a channel layer of the thin film transistor, an active layer of the diode, and a first resistance layer of the resistor; and forming a second patterned conductive layer on the patterned semiconductor layer, the second patterned conductive layer comprising a source and a drain of the thin film transistor, an ohmic contact layer of the diode, an upper electrode of the capacitor and a second resistance layer of the resistor.

* * * * *